US008713399B1

(12) United States Patent
Tsatsaragkos et al.

(10) Patent No.: US 8,713,399 B1
(45) Date of Patent: Apr. 29, 2014

(54) RECONFIGURABLE BARREL SHIFTER AND ROTATOR

(71) Applicant: Antcor S.A., Athens (GR)

(72) Inventors: Ioannis Tsatsaragkos, Patras (GR); Vassilis Paliouras, Patras (GR)

(73) Assignee: Antcor S.A. (GR)

( * ) Notice: Subject to any disclaimer, the term of this patent is extended or adjusted under 35 U.S.C. 154(b) by 0 days.

(21) Appl. No.: 14/051,144

(22) Filed: Oct. 10, 2013

(51) Int. Cl.
 *H03M 13/00* (2006.01)
(52) U.S. Cl.
 USPC ............................................ 714/752; 714/786
(58) Field of Classification Search
 USPC ................................................. 714/752, 786
 See application file for complete search history.

(56) References Cited

U.S. PATENT DOCUMENTS

| 5,278,703 A * | 1/1994 | Rub et al. ......................... 360/51 |
| 5,278,846 A * | 1/1994 | Okayama et al. ............. 714/755 |
| 5,317,472 A * | 5/1994 | Schweitzer, III .............. 361/115 |
| 5,325,402 A * | 6/1994 | Ushirokawa .................. 375/341 |
| 5,392,299 A * | 2/1995 | Rhines et al. ................. 714/756 |
| 2006/0256670 A1 * | 11/2006 | Park et al. ........................ 369/43 |
| 2008/0069373 A1 * | 3/2008 | Jiang et al. .................... 381/94.1 |
| 2008/0132893 A1 * | 6/2008 | D'Amelio et al. ............... 606/52 |
| 2008/0243974 A1 * | 10/2008 | Paumier et al. ............... 708/209 |
| 2011/0164669 A1 * | 7/2011 | Mathew et al. ................ 375/227 |
| 2011/0264987 A1 * | 10/2011 | Li et al. ......................... 714/785 |
| 2012/0226281 A1 * | 9/2012 | Sackett et al. ................... 606/80 |

OTHER PUBLICATIONS

M. R. Pillmeier, M. J. Schulte and E. G. Walters III, "Design alternatives for barrel shifters", in Proc. SPIE 4791, Advanced Signal Processing Algorithms, Architectures, and Implementations XII, 436 , Dec. 2002.
I. Tsatsaragkos and V. Paliouras, "A Flexible Layered LDPC Decoder," in Proc. of 8th International Symposium on Wireless Communication Systems (ISWC), IEEE, pp. 36-40, 2011.
M. Awais and C. Condo, "Flexible LDPC decoder architectures," in VLSI Design, vol. 2012, pp. 1-16, 2012.

* cited by examiner

*Primary Examiner* — Esaw Abraham
(74) *Attorney, Agent, or Firm* — Westberg Law Offices (57) ABSTRACT

The present invention is directed toward reconfigurable barrel shifters and rotators. A barrel shifter comprises an array of multiplexers, the array having a plurality of inputs and a plurality of outputs and wherein the array of multiplexers is configured to rotate a set of n input messages applied to the inputs by a selected number of positions at the outputs and wherein the number n of messages contained in the set is selectable from among a plurality of values, by changing only select control signal inputs to the array of multiplexers.

18 Claims, 11 Drawing Sheets

Inputs $$\begin{array}{c} \\ \text{Outputs} \end{array} \begin{array}{c} 0 \\ 1 \\ 2 \\ 3 \\ 4 \\ 5 \end{array} \begin{bmatrix} 0 & 1 & 2 & 3 & 4 & 5 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ 1 & 0 & 0 & 0 & 0 & 0 \\ 0 & 1 & 0 & 0 & 0 & 0 \end{bmatrix}$$

| Check Nodes \ Variable Nodes | 0 | 27 | 54 | 81 | 108 | 135 | 162 | 189 | 216 | 243 | 270 | 297 | 324 | 351 | 378 | 405 | 432 | 459 | 486 | 513 | 540 | 567 | 594 | 621 | 648 |
|---|---|---|---|---|---|---|---|---|---|---|---|---|---|---|---|---|---|---|---|---|---|---|---|---|---|
| 0 | 0 | -1 | -1 | 0 | 0 | -1 | 0 | -1 | -1 | 0 | -1 | -1 | 0 | 1 | -1 | -1 | -1 | -1 | -1 | -1 | -1 | -1 | -1 | -1 | -1 |
| 27 | 22 | 0 | -1 | -1 | -1 | 0 | 0 | 0 | 12 | -1 | -1 | -1 | 0 | -1 | 0 | -1 | -1 | -1 | -1 | -1 | -1 | -1 | -1 | -1 | -1 |
| 54 | 6 | -1 | 0 | -1 | -1 | 17 | -1 | -1 | 24 | 0 | -1 | -1 | -1 | -1 | 0 | 0 | -1 | -1 | -1 | -1 | -1 | -1 | -1 | -1 | -1 |
| 81 | 2 | -1 | -1 | 0 | -1 | 10 | -1 | -1 | 25 | -1 | 0 | -1 | -1 | -1 | -1 | 0 | 0 | -1 | -1 | -1 | -1 | -1 | -1 | -1 | -1 |
| 108 | 23 | -1 | 23 | -1 | 1 | 20 | -1 | -1 | 0 | -1 | -1 | 9 | 11 | -1 | -1 | -1 | 0 | 0 | -1 | -1 | -1 | -1 | -1 | -1 | -1 |
| 135 | 24 | -1 | -1 | -1 | -1 | 3 | -1 | 3 | 10 | -1 | -1 | -1 | -1 | 0 | -1 | -1 | -1 | 0 | 0 | -1 | -1 | -1 | -1 | -1 | -1 |
| 162 | 25 | -1 | -1 | -1 | -1 | 17 | -1 | -1 | 7 | 18 | -1 | -1 | -1 | -1 | -1 | -1 | -1 | -1 | 0 | 0 | -1 | -1 | -1 | -1 | -1 |
| 189 | 13 | -1 | -1 | -1 | -1 | 8 | -1 | 8 | 6 | -1 | -1 | -1 | -1 | -1 | -1 | -1 | -1 | -1 | -1 | 0 | 0 | -1 | -1 | -1 | -1 |
| 216 | 7 | 24 | -1 | -1 | 16 | 0 | 10 | -1 | 23 | -1 | 18 | -1 | -1 | -1 | -1 | -1 | -1 | -1 | -1 | -1 | 0 | 0 | -1 | -1 | -1 |
| 243 | 11 | 20 | -1 | -1 | -1 | 22 | -1 | -1 | 13 | -1 | -1 | 3 | 17 | -1 | -1 | -1 | -1 | -1 | -1 | -1 | -1 | 0 | 0 | -1 | -1 |
| 270 | 25 | -1 | -1 | 8 | -1 | 19 | -1 | -1 | 9 | 14 | -1 | -1 | -1 | -1 | -1 | -1 | -1 | -1 | -1 | -1 | -1 | -1 | 0 | 0 | -1 |
| 297 | 3 | -1 | -1 | -1 | -1 | 23 | 18 | -1 | 25 | 2 | 5 | -1 | -1 | -1 | -1 | -1 | -1 | -1 | -1 | -1 | -1 | -1 | -1 | 0 | 0 |
| 324 | -1 | -1 | -1 | -1 | -1 | 16 | -1 | -1 | -1 | -1 | -1 | -1 | -1 | -1 | -1 | -1 | -1 | -1 | -1 | -1 | -1 | -1 | -1 | -1 | 0 |

FIG. 9

|   | 54 | 108 | 162 | 216 | 270 | 324 | 378 | 432 | 486 | 540 | 594 | 648 | 702 | 756 | 810 | 864 | 918 | 972 | 1026 | 1080 | 1134 | 1188 | 1242 | 1296 |
|---|---|---|---|---|---|---|---|---|---|---|---|---|---|---|---|---|---|---|---|---|---|---|---|---|
| 0 | 40 | -1 | -1 | -1 | 22 | -1 | 49 | 23 | 43 | -1 | -1 | -1 | 1 | -1 | -1 | -1 | -1 | -1 | -1 | -1 | -1 | -1 | -1 | -1 |
| 54 | 50 | 1 | -1 | -1 | 48 | 35 | -1 | -1 | 13 | -1 | 30 | -1 | -1 | 0 | -1 | -1 | -1 | -1 | -1 | -1 | -1 | -1 | -1 | -1 |
| 108 | 39 | 50 | -1 | -1 | 4 | -1 | 2 | -1 | -1 | -1 | -1 | 49 | -1 | -1 | 0 | -1 | -1 | -1 | -1 | -1 | -1 | -1 | -1 | -1 |
| 162 | 33 | -1 | -1 | 38 | 37 | -1 | -1 | -1 | -1 | 42 | -1 | -1 | -1 | -1 | -1 | 0 | -1 | -1 | -1 | -1 | -1 | -1 | -1 | -1 |
| 216 | 45 | -1 | -1 | -1 | 0 | 22 | -1 | -1 | 1 | -1 | -1 | -1 | -1 | -1 | -1 | -1 | 0 | -1 | -1 | -1 | -1 | -1 | -1 | -1 |
| 270 | 51 | -1 | -1 | 48 | 35 | -1 | -1 | -1 | 20 | -1 | 18 | -1 | -1 | -1 | -1 | -1 | -1 | 0 | -1 | -1 | -1 | -1 | -1 | -1 |
| 324 | 47 | 11 | -1 | -1 | 6 | 17 | -1 | -1 | 44 | 40 | -1 | -1 | -1 | -1 | -1 | -1 | -1 | -1 | 0 | -1 | -1 | -1 | -1 | -1 |
| 378 | 5 | -1 | 25 | -1 | 24 | -1 | 45 | -1 | 51 | -1 | -1 | 46 | -1 | -1 | -1 | -1 | -1 | -1 | -1 | 0 | -1 | -1 | -1 | -1 |
| 432 | 33 | -1 | -1 | 34 | 1 | -1 | -1 | -1 | 13 | -1 | 44 | -1 | -1 | -1 | -1 | -1 | -1 | -1 | -1 | -1 | 0 | -1 | -1 | -1 |
| 486 | 1 | -1 | 27 | -1 | 23 | -1 | -1 | -1 | 23 | 38 | -1 | -1 | -1 | -1 | -1 | -1 | -1 | -1 | -1 | -1 | -1 | 0 | -1 | -1 |
| 540 | -1 | 18 | -1 | -1 | 30 | -1 | -1 | 8 | 0 | -1 | -1 | -1 | -1 | -1 | -1 | -1 | -1 | -1 | -1 | -1 | -1 | -1 | 0 | -1 |
| 594 | 49 | -1 | 17 | -1 | -1 | -1 | -1 | -1 | 34 | 35 | -1 | 19 | -1 | -1 | -1 | -1 | -1 | -1 | -1 | -1 | -1 | -1 | -1 | 0 |
| 648 |   |   |   |   |   |   |   |   |   |   |   |   |   |   |   |   |   |   |   |   |   |   |   |   |

FIG. 10

| | 81 | 162 | 243 | 324 | 405 | 486 | 567 | 648 | 729 | 810 | 891 | 972 | 1053 | 1134 | 1215 | 1296 | 1377 | 1458 | 1539 | 1620 | 1701 | 1782 | 1863 | 1944 |
|---|---|---|---|---|---|---|---|---|---|---|---|---|---|---|---|---|---|---|---|---|---|---|---|---|
| 0 | 57 | -1 | -1 | -1 | 50 | -1 | -1 | -1 | 50 | -1 | 79 | -1 | 1 | -1 | 0 | -1 | -1 | -1 | -1 | -1 | -1 | -1 | -1 | -1 |
| 81 | 3 | 28 | -1 | -1 | 0 | -1 | 11 | -1 | 55 | 7 | -1 | -1 | -1 | 0 | 0 | -1 | -1 | -1 | -1 | -1 | -1 | -1 | -1 | -1 |
| 162 | 30 | -1 | -1 | -1 | 24 | 37 | -1 | -1 | 56 | 14 | -1 | -1 | -1 | -1 | 0 | 0 | -1 | -1 | -1 | -1 | -1 | -1 | -1 | -1 |
| 243 | 62 | 53 | -1 | -1 | 53 | -1 | -1 | -1 | 35 | -1 | -1 | -1 | -1 | -1 | -1 | 0 | 0 | -1 | -1 | -1 | -1 | -1 | -1 | -1 |
| 324 | 40 | -1 | 20 | -1 | 66 | -1 | -1 | 3 | 28 | -1 | -1 | -1 | -1 | -1 | -1 | -1 | 0 | 0 | -1 | -1 | -1 | -1 | -1 | -1 |
| 405 | 0 | -1 | -1 | -1 | 8 | -1 | 42 | 22 | 50 | -1 | -1 | 8 | -1 | -1 | -1 | -1 | -1 | 0 | 0 | -1 | -1 | -1 | -1 | -1 |
| 486 | 69 | 79 | -1 | -1 | -1 | -1 | 56 | -1 | 52 | -1 | -1 | -1 | 0 | -1 | -1 | -1 | -1 | -1 | 0 | 0 | -1 | -1 | -1 | -1 |
| 567 | 65 | -1 | -1 | 38 | -1 | 57 | -1 | -1 | 72 | 27 | -1 | -1 | -1 | -1 | -1 | -1 | -1 | -1 | -1 | 0 | 0 | -1 | -1 | -1 |
| 648 | 64 | -1 | -1 | 14 | -1 | 52 | -1 | -1 | 30 | -1 | 32 | -1 | -1 | -1 | -1 | -1 | -1 | -1 | -1 | -1 | 0 | 0 | -1 | -1 |
| 729 | -1 | -1 | 70 | 0 | -1 | -1 | -1 | -1 | 77 | 9 | -1 | -1 | -1 | -1 | -1 | -1 | -1 | -1 | -1 | -1 | -1 | 0 | 0 | -1 |
| 810 | 2 | 45 | 57 | 35 | -1 | -1 | -1 | -1 | -1 | -1 | 12 | -1 | -1 | -1 | -1 | -1 | -1 | -1 | -1 | -1 | -1 | -1 | 0 | 0 |
| 891 | 24 | 56 | -1 | -1 | 60 | -1 | -1 | 27 | 51 | -1 | -1 | 16 | 1 | -1 | -1 | -1 | -1 | -1 | -1 | -1 | -1 | -1 | -1 | 0 |

FIG. 11

RECONFIGURABLE BARREL SHIFTER AND ROTATOR

BACKGROUND OF THE INVENTION

The present invention relates to the field of circuits for shifting data, and more particularly, the present invention relates to barrel rotators.

A barrel shifter is a digital circuit that can shift a data word or an ordered list of elements by a specified number of bits or positions in a single clock cycle. A sub-category of barrel shifters is the barrel rotators, which are circuits that perform circular-shift operations. A circular, or cyclic, shift is the operation of rearranging the entries in an ordered list of elements, either by moving the final entry to the first position, while shifting all other entries to the next position, or by performing the inverse operation. The result of repeatedly applying s circular shifts to a given set of entries is called a circular shift by s positions. Shifting and rotating data is required in several applications including arithmetic operations, variable-length coding, and bit-indexing. Barrel rotators are often utilized by embedded digital signal processors and general-purpose processors to manipulate data.

Barrel rotators are widely used in Low Density Parity Check (LDPC) decoders. LDPC codes are a subcategory of linear block error correction codes characterized by a sparse parity check matrix. This means that the parity check matrix consists mainly of 0's and a relatively small number of 1's. LDPC codes were first introduced in the 1960's but have more recently received increased attention. This is due at least in part to inherent parallelism in decoding which makes LDPC codes suitable for hardware implementation and due to flexibility in designing LDPC codes, which allows LDPC codes to be used in a variety of applications.

A bipartite Tanner graph is a widely used way to represent a parity check matrix H. This graph consists of two sets of nodes, namely the check nodes and the variable nodes. Each row of H corresponds to a parity check equation, graphically represented as a check node of the Tanner graph, while columns correspond to the codeword bits, graphically represented as variable nodes. An ace in the H matrix indicates a connection between the corresponding variable and check nodes. Message passing algorithms for decoding LDPC codes operate by iteratively passing information along the edges of the Tanner graph. In a sense, the variable nodes correspond to bits of a received word—both message and parity—while check nodes correspond to parity check equations.

Figure 7:
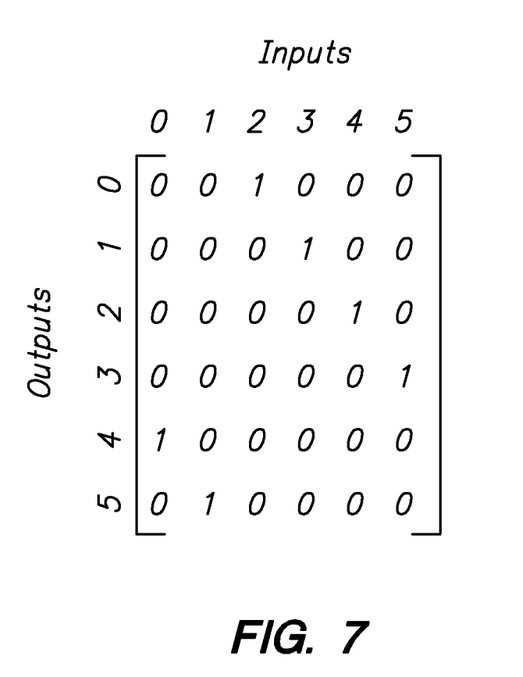
FIG. 7 illustrates a 6×6 identity sub-matrix right circularly shifted by 2 columns.
Figure 8:
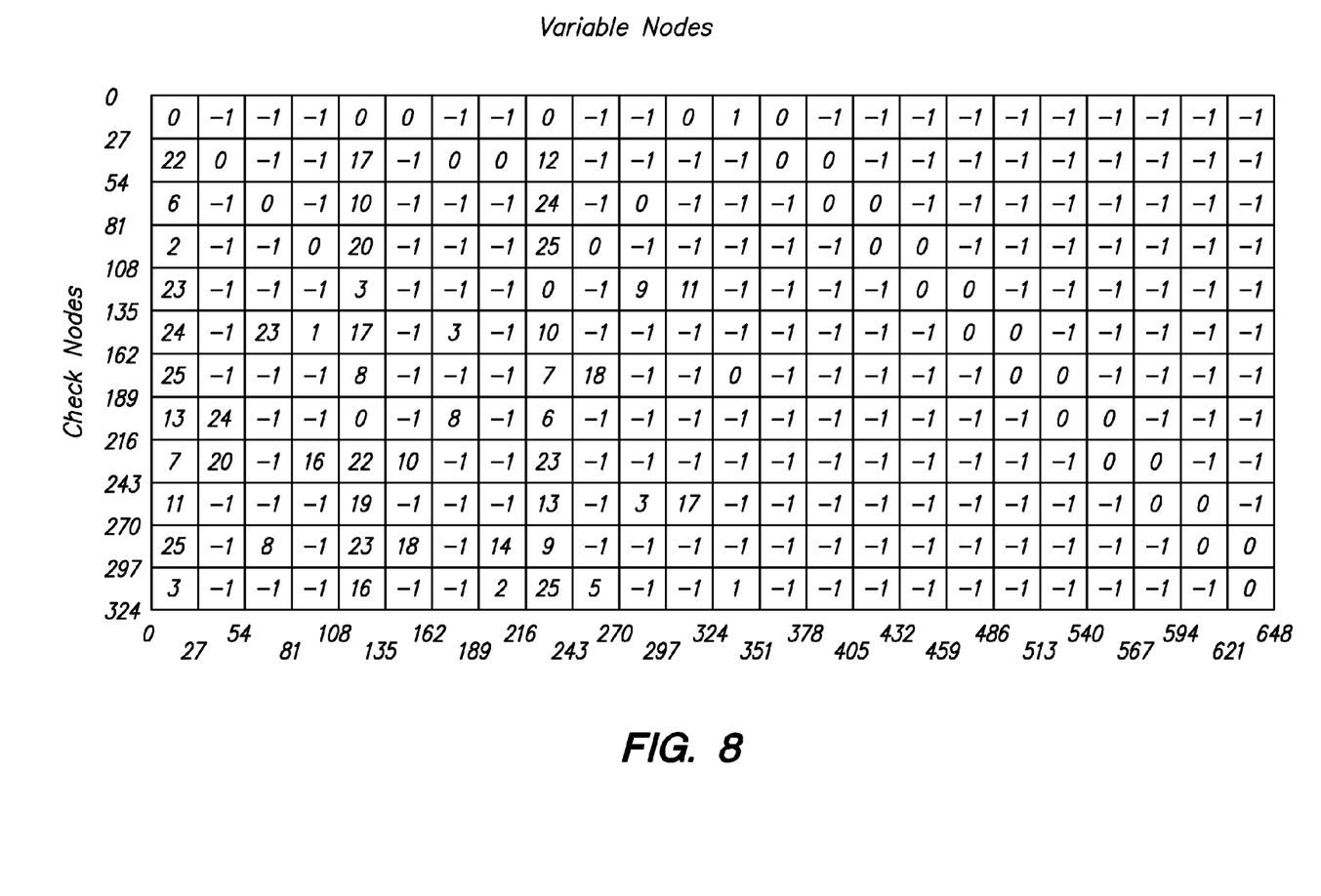
FIG. 8 illustrates the code-rate-1/2, 648-bit code of the IEEE 802.11n/ac standards in a compact representation.
Figure 9:
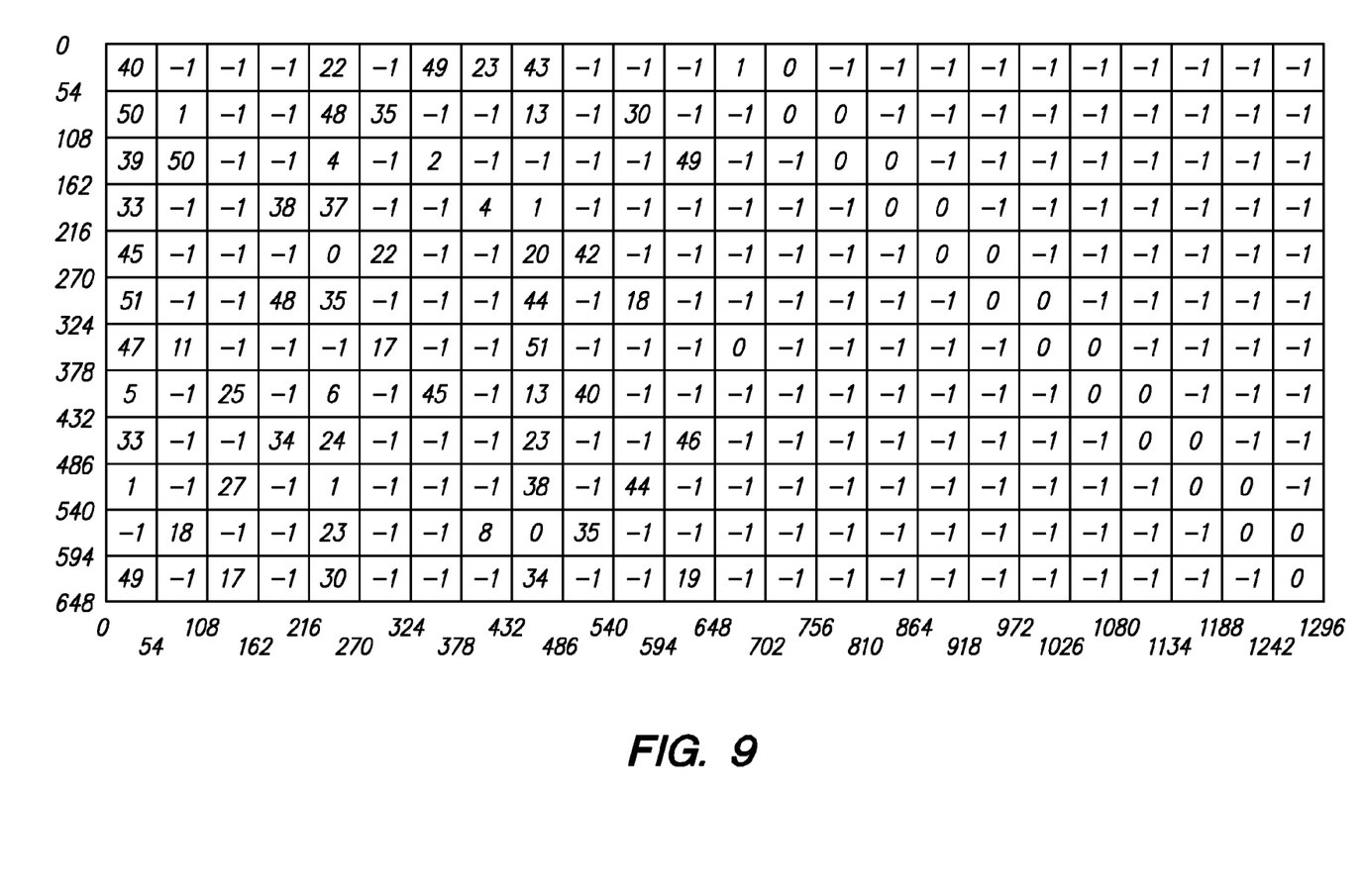
FIG. 9 illustrates the code-rate-1/2, 1296-bit code of the IEEE 802.11n/ac standards in a compact representation.
Figure 10:
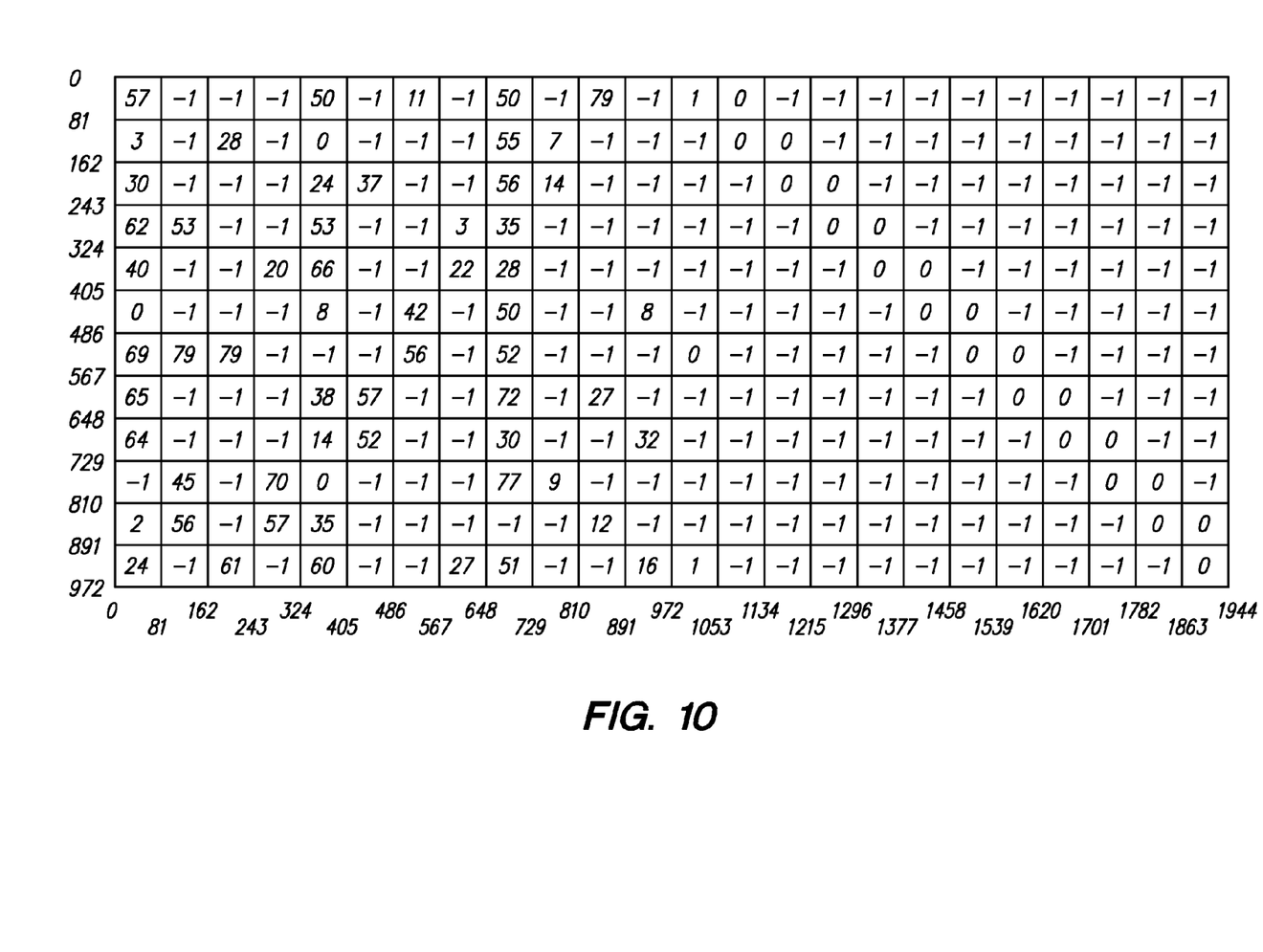
FIG. 10 illustrates the code-rate-1/2, 1944-bit code of the IEEE 802.11n/ac standards in a compact representation.

Decoding of LDPC codes often requires shift or shuffle operations to route information between processing elements or to/from memories. This is particularly true for some kinds of LDPC codes, including Quasi-Cyclic LDPC (QC-LDPC) codes. QC-LDPC codes are a subcategory of LDPC codes characterized by parity check matrices comprised of square sub-matrices. Each of these sub-matrices is either a z×z zero sub-matrix or a z×z right circularly shifted identity sub-matrix. FIG. 7 represents a 6×6 identity sub-matrix right circularly shifted by 2 columns. FIG. 8 illustrates the code-rate-1/2, 648-bit code defined in the IEEE 802.11n and the IEEE 802.11ac standards, in a compact form. The actual parity check matrix of this code-rate-1/2, 648-bit LDPC code, is derived from this compact representation by replacing each −1 value by the z×z zero sub-matrix, where z=27, and each s value equal or greater than 0, by a z×z identity sub-matrix right circularly shifted by s columns. We call value s rotate factor of the corresponding square sub-matrix, and s∈{0, 1, . . . , z−1}. FIG. 9 represents the code-rate-1/2, 1296-bit code and FIG. 10 represents the code-rate-1/2, 1944-bit code of the IEEE 802.11n/ac standards. The standards support twelve different LDPC codes. More specifically, three codeword lengths (648, 1296, 1944) and four coding rates (1/2, 2/3, 3/4, 5/6) are supported. Generally, the dimensions of a code-rate-r, $n_c$-bit code of the IEEE 802.11n/ac standards is given by $(24 \cdot (1-r) \cdot z) \times n_c$, where $n_c = 24 \cdot z$. The value z is equal to 27 in case $n_c$ is equal to 648, z=54 in case $n_c$=1296 and z=81 in case $n_c$=1944. The barrel rotator is a well-known circuit designed to perform all the permutations of its inputs obtainable with a circular shift operation (rotations), thus being well suited for the circularly shifted structure of the QC-LDPC H matrix.

QC-LDPC codes are widely used in error correction systems due to resulting lower hardware complexity and comparable performance to randomly constructed codes. The particular structure of the QC-LDPC codes ensures that there is at most one unique ace in every column of the z×z square sub-matrices which compose these codes. This allows the parallel processing of up to z lines of the parity check matrix without data conflicts. As mentioned before and depicted in FIG. 8, in an implementation of an LDPC decoder circuit each row of H corresponds to a check node processing element, while columns correspond to variable node processing elements. A barrel rotator is a suitable circuit to realize the rotations of the QC-LDPC sub-matrices. These rotations define the interconnection between the basic processing elements of a QC-LDPC decoder which are the variable node processing elements and the check node processing elements. There is a variety of partially-parallel QC-LDPC decoder implementations, where there is a necessity of an efficient permutation network, able to interconnect a number of n variable node processing elements with n check node processing elements.

Telecommunication standards, such as WiMAX and WiFi, support a variety of codes. An LDPC decoder architecture suitable for the 802.11n/ac IEEE standards would ideally support three codeword lengths (648, 1296, 1944) and four coding rates (1/2, 2/3, 3/4, 5/6) in order to implement the twelve LDPC parity check matrices defined by the standard. To accommodate multiple codes of different characteristics, such as length, rate, and check degrees of each parity check matrix, there is a need for a reconfigurable interconnection network that efficiently realizes connectivity between variable and check node processors of a decoder.

SUMMARY OF THE INVENTION

The present invention is directed toward reconfigurable barrel shifters and rotators. A barrel shifter comprises an array of multiplexers, the array having a plurality of inputs and a plurality of outputs and wherein the array of multiplexers is configured to rotate a set of n input messages applied to the inputs by a selected number of positions at the outputs and wherein the number n of messages contained in the set is selectable from among a plurality of values, by changing only select control signal inputs to the array of multiplexers.

BRIEF DESCRIPTION OF THE DRAWINGS

The present invention is described with respect to particular exemplary embodiments thereof and reference is accordingly made to the drawings in which.

DETAILED DESCRIPTION OF A PREFERRED EMBODIMENT OF THE INVENTION

The present invention is directed toward a reconfigurable barrel rotator circuit. Embodiments of present invention are particularly useful for use in QC-LDPC decoders and, more particularly, for use in interconnection networks for QC-LDPC decoders. It will be apparent that embodiments of the present invention can be applied in other contexts where shifting and rotating data is useful, such as arithmetic operations, variable-length coding, and bit-indexing.

Figure 1:
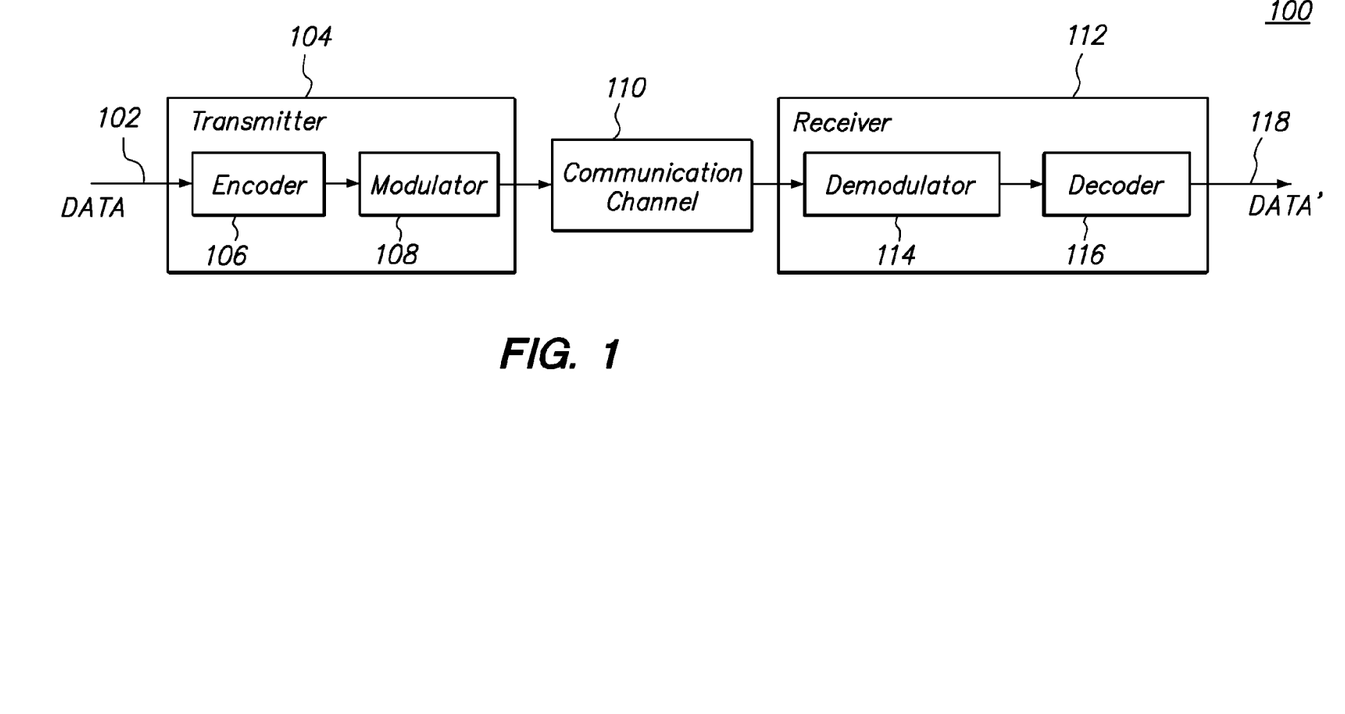
FIG. 1 illustrates a communication system in which embodiments of the present invention can be implemented.

FIG. 1 illustrates a communication system 100 in which embodiments of the present invention can be implemented. As shown in FIG. 1, digital data 102 to be transmitted is input to a transmitter 104. The transmitter 104 can include an encoder 106 and a modulator 108. The encoder 106 performs error correction coding on the data, for example, by breaking the data 102 into messages of fixed size and encoding the messages into codewords. Redundancy can be inserted during the encoding process so that the codewords are made larger than the messages.

The modulator 108 can then prepare the codewords for transmission by modulating one or more carrier signals in accordance with the codewords. As an example, the modulation can be performed in accordance with orthogonal frequency division multiplexing (OFDM). Each modulated and encoded signal can then be transmitted via a communication channel 110. The channel 110 can be, for example, a wireless communication channel which can be, for example, part of a wireless local area network (WLAN).

A receiver 112 receives the transmitted signal from the channel 110. The receiver 112 can include a demodulator 114 and a decoder 116. The demodulator 114 demodulates the received signal as to reconstruct the codewords. The codewords can then be decoded by the decoder 116 in order to reconstruct the original data 102. While the decoder 116 can correct certain errors introduced by the communication process, the data 118 output from the decoder 112 can differ from the original data 102 due to uncorrected errors that remain.

Figure 2:
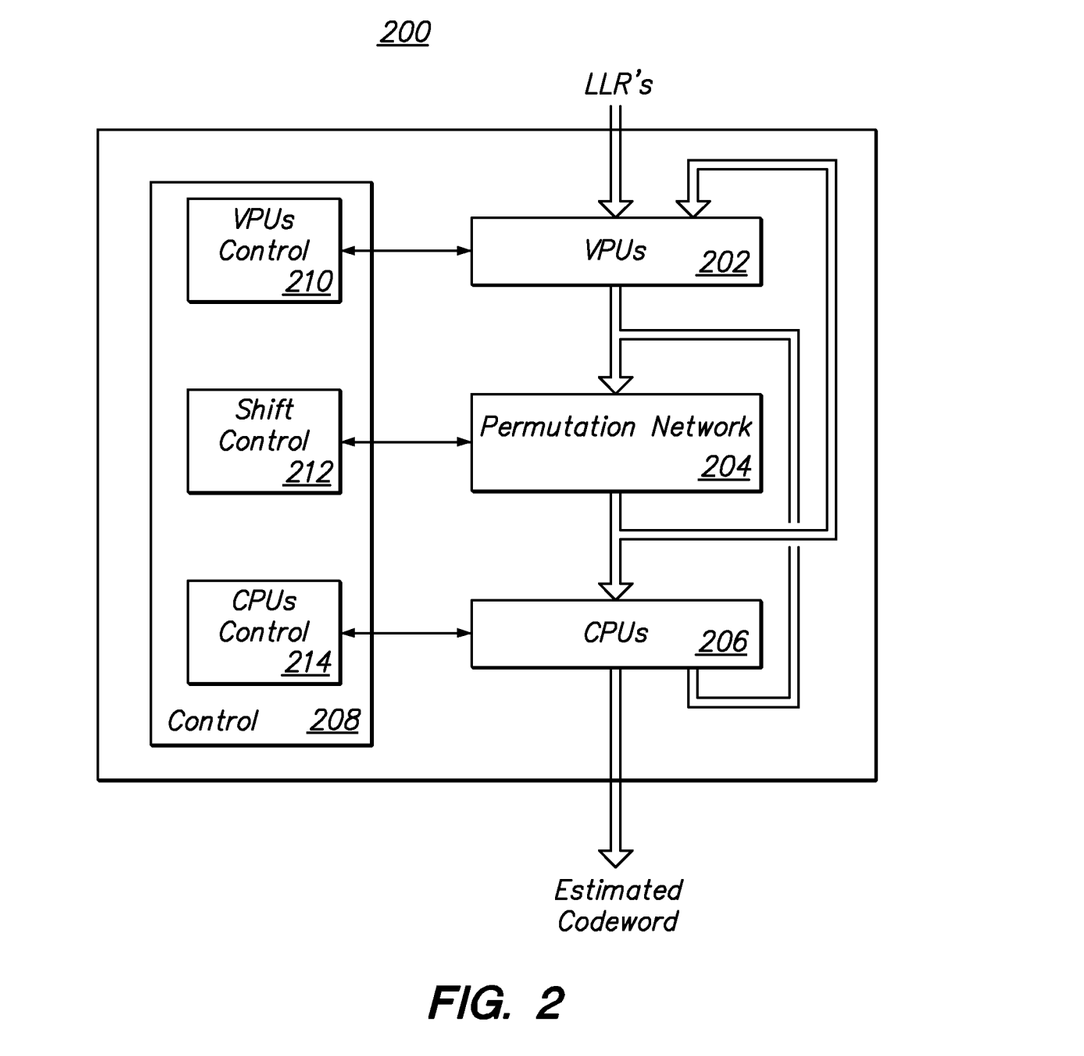
FIG. 2 illustrates an error correction decoder in accordance with an embodiment of the present invention.

FIG. 2 illustrates an error correction decoding unit 200 in accordance with an embodiment of the present invention. The error correction decoding unit 200 shown in FIG. 2 can be included in the error correction decoder 116 of FIG. 1. As shown in FIG. 2 the decoding unit 200 includes a variable node processing unit 202, which can include a plurality of variable node processors (VPUs). The decoding unit 200 also includes a permutation network 204 and a check node processing unit 206. The check node processing unit 206 can include a plurality of check node processors (CPUs). The permutation network 204 provides a means for passing data among the VPUs of the variable node processing unit 202 and the CPUs of the check node processing unit 206.

A control unit 208 controls operation of the decoding unit 200. For this purpose, the control unit 208 includes a VPUs controller 210, a shifter controller 212 and a CPUs controller 214. The VPUs controller 210 controls operation of the VPUs of the variable node processing unit 202. The shifter controller 212 controls operation of the permutation network 204 and CPUs controller 214 controls operation of the CPUs of the check node processing unit 206.

Elements of the decoding unit 200 are implemented with hardware circuitry, which can include memory, registers, logic circuitry, general-purpose and/or specialized processors, machine-readable software, application specific integrated circuits (ASICs), programmable logic arrays (PLAs), and so forth. It will be apparent that the particular arrangement of the decoding unit 200 is exemplary and that embodiments of the present invention can be employed in conjunction with other decoder arrangements and architectures.

Sum-product message passing and its approximations, such as min-sum, normalized min-sum and offset min-sum algorithms, can be performed by the decoding unit 200. In this case, probabilistic information, e.g. in the form of log-likelihood ratios (LLRs), can be passed between the VPUs and the CPUs by the permutation network 204. The decoding unit 200 can be initialized with LLRs that pertain to bits of a codeword received from the communication channel 110. Decoding is performed through an iterative process of information exchange between VPUs and CPUs. This procedure is called belief propagation. In the traditional fully parallel, two-phased decoding scheduling the calculation of all check nodes follows the calculation of all the variable nodes and vice-versa. For each half-iteration, the VPUs take inputs from the CPUs and compute outputs for the CPUs. For the next half-iteration, the CPUs take inputs from the VPUs and compute outputs for the VPUs. These iterations can be repeated until an estimated codeword is found or some other stopping criterion is reached. In layered decoding the rows of the parity check matrix H get processed in subsets, or layers, in successive order. Each one of the layered decoding iterations is divided into a sequence of sub-iterations. For each half-sub-iteration, the VPUs take inputs from the CPUs and compute outputs for the CPUs. For the next half-sub-iteration, the CPUs take inputs from the VPUs and compute outputs for the VPUs.

Figure 5:
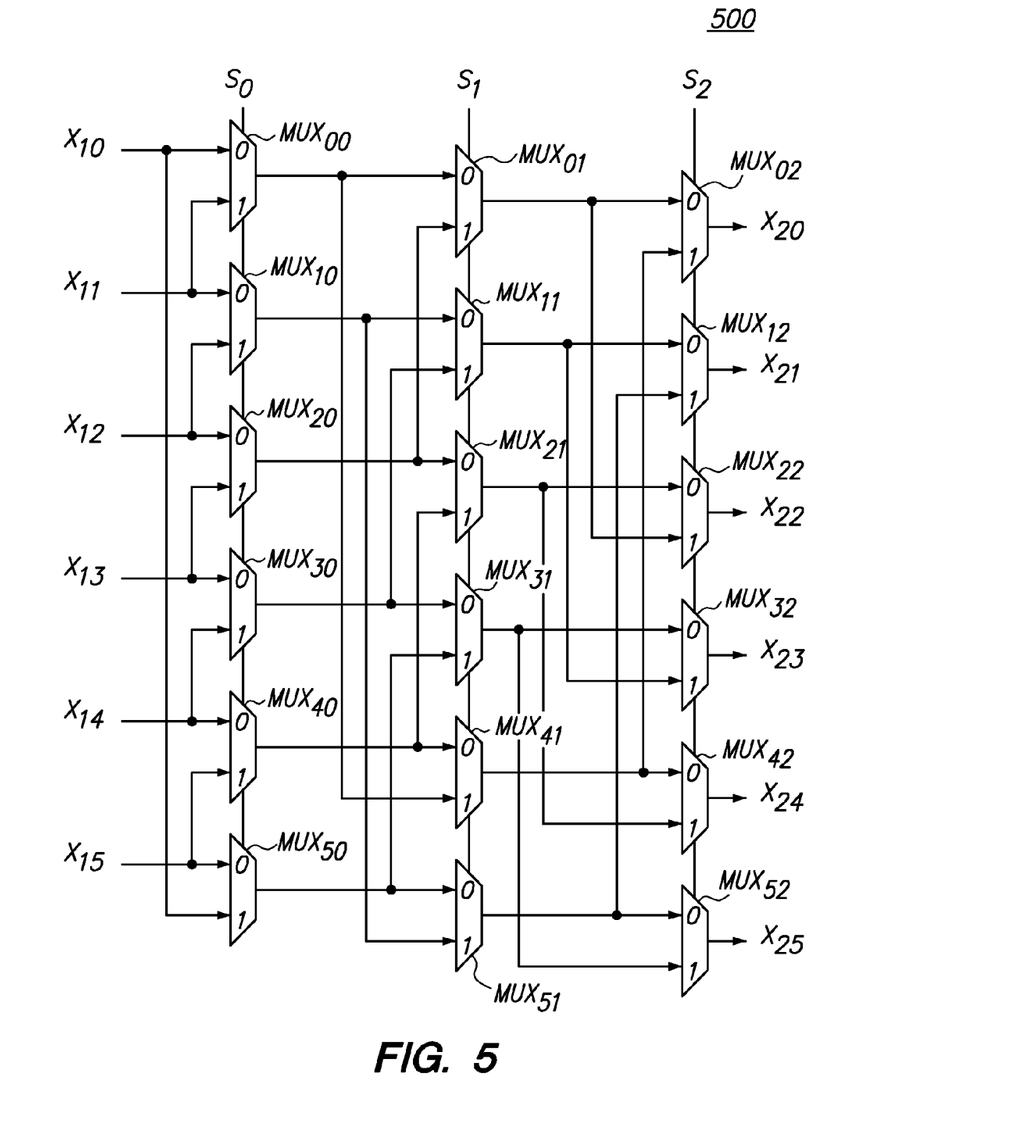
FIG. 5 illustrates a second barrel rotator circuit whose function can be performed by the reconfigurable barrel rotator circuit of FIG. 3

For the case of QC-LDPC codes, the permutation network 204 should be a circuit able to circularly shift, i.e., to rotate its inputs. Such a circuit realizes the connectivity determined by a circularly shifted identity sub-matrix $H_x$, where the inputs of the circuit correspond to the columns of $H_x$, the outputs correspond to the rows of $H_x$, and an ace in column h and row g indicates a connection between the input h and output g of the circuit. With reference to FIG. 7, for a rotate factor s equal to 2, input 0 is connected to output 4, input 1 is connected to output 5, input 2 is connected to output 0, input 3 is connected to output 1, input 4 is connected to output 2 and input 5 is connected to output 3. A circuit capable of performing this operation is a logarithmic barrel rotator which is shown in FIG. 5.

An LDPC decoder architecture suitable for the 802.11n/ac IEEE standards would ideally support three codeword lengths (648, 1296, 1944) and four coding rates (1/2, 2/3, 3/4, 5/6) in order to implement the twelve LDPC parity check matrices defined by the standard. To accommodate multiple codes of different characteristics, such as length, rate, and check degrees of each parity check matrix, there is a need for a reconfigurable interconnection network that efficiently realizes connectivity between variable and check node processors of a decoder. The challenge lies in the fact that the same circuit should be capable of interconnecting a variable number n of variable node processing elements with n check node processing elements, realizing the aforementioned cyclic-shift operations.

Figure 3:
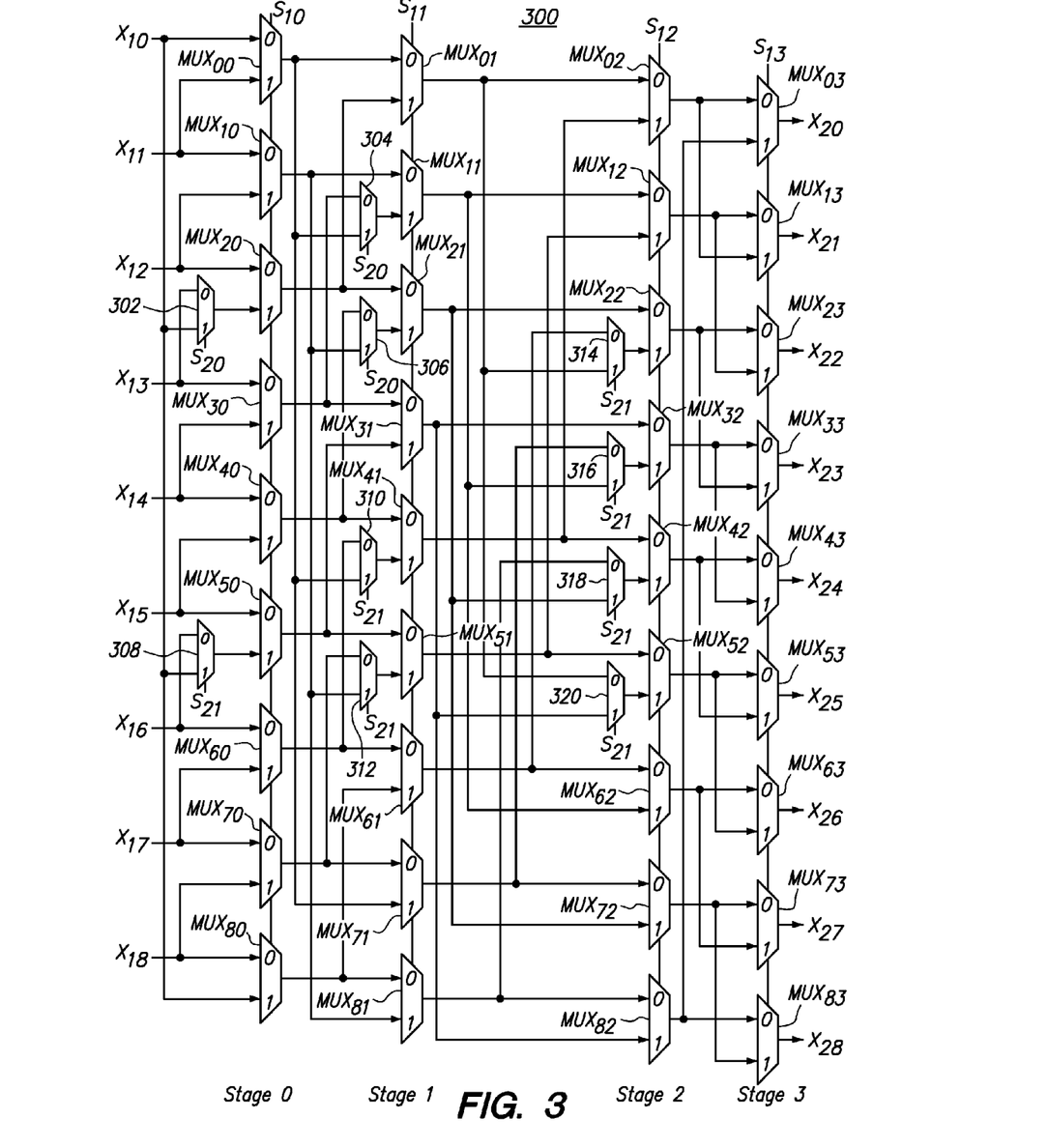
FIG. 3 illustrates a reconfigurable barrel rotator circuit in accordance with an embodiment of the present invention.

FIG. 3 illustrates reconfigurable barrel rotator circuit 300 in accordance with an embodiment of the present invention. The barrel rotator circuit 300 of FIG. 3 can be included in the permutation network 204 of FIG. 2. The barrel rotator circuit 300 can perform a rotate-left or rotate-right operation on any message, or simply pass its input to its output.

As shown in FIG. 3, the barrel rotator circuit 300 includes a plurality of m-bit multiplexers arranged in stages. The value of m can be larger than or equal to 1 (e.g, 8, 64, etc.). In the embodiment of FIG. 3, the barrel rotator circuit 300 includes four stages, numbered 0 through 3. Each stage includes a plurality of n=9 basic multiplexers—from now on, we call these multiplexers primary—and stages 0, 1 and 2 include a plurality of additional multiplexers—from now on, we call these multiplexers secondary. Stage 0 includes primary multiplexers $MUX_{00}$, $MUX_{10}$, $MUX_{20}$, $MUX_{30}$, $MUX_{40}$, $MUX_{50}$, $MUX_{60}$, $MUX_{70}$, and $MUX_{80}$. Stage 1 includes primary multiplexers $MUX_{01}$, $MUX_{11}$, $MUX_{21}$, $MUX_{31}$, $MUX_{41}$, $MUX_{51}$, $MUX_{61}$, $MUX_{71}$, and $MUX_{81}$. Stage 2 includes primary multiplexers $MUX_{02}$, $MUX_{12}$, $MUX_{22}$, $MUX_{32}$, $MUX_{42}$, $MUX_{52}$, $MUX_{62}$, $MUX_{72}$, and $MUX_{82}$. Stage 3 includes primary multiplexers $MUX_{03}$, $MUX_{13}$, $MUX_{23}$, $MUX_{33}$, $MUX_{43}$, $MUX_{53}$, $MUX_{63}$, $MUX_{73}$, and $MUX_{83}$. In FIGS. 3-6, the primary multiplexers are assigned a name of the form $MUX_{jk}$. Multiplexer $MUX_{jk}$ is the j-th primary multiplexer, or primary multiplexer j, of stage k.

In addition to the primary multiplexers described above, the barrel rotator circuit of FIG. 3 includes m-bit secondary multiplexers 302, 304, 306, 308, 310, 312, 314, 316, 318 and 320. Secondary multiplexers 302 and 308 are included in stage 0, secondary multiplexers 304, 306, 310 and 312 are included in stage 1, and secondary multiplexers 314, 316, 318 and 320 are included in stage 2. The barrel rotator 300 has inputs $X_{10}$, $X_{11}$, $X_{12}$, $X_{13}$, $X_{14}$, $X_{15}$, $X_{16}$, $X_{17}$ and $X_{18}$ and outputs $X_{20}$, $X_{21}$, $X_{22}$, $X_{23}$, $X_{24}$, $X_{25}$, $X_{26}$, $X_{27}$ and $X_{28}$. Thus, the primary inputs/outputs are denoted as $X_{yj}$, where y=1 for inputs and y=2 for outputs. Data appearing at the inputs can be circularly shifted right or left by a selected number of positions with the resulting rotated data appearing at the outputs. Select inputs $S_{10}$, $S_{11}$, $S_{12}$, $S_{13}$, $S_{20}$, and $S_{21}$ are used to control operation of the barrel rotator.

We define F to be a set of n input messages, s to be the rotate factor (s $\epsilon$ {0, 1, . . . , n−1}), r to be a binary value which indicates left or right rotation, where r=0 for left rotation and r=1 for right rotation, and G to be the set of the rotated output messages. An n-message rotate-left by s operation performs an n-message left rotation, setting the i-th message of F to the l-th position of G, where i, l$\epsilon$ {0, 1, . . . , n−1} and l=mod((i−s), n). An n-message rotate-right by s operation performs an n-message right rotation, setting the i-th message of F to the l-th position of G, where i, l$\epsilon$ {0, 1, . . . , n−1} and l=mod((i+s), n). For example, assuming a set F of n=9 messages, where F=[$m_0$, $m_1$, $m_2$, $m_3$, $m_4$, $m_5$, $m_6$, $m_7$, $m_8$], s=5 and r=0, the result of the rotate-left operation in F is the set G=[$m_5$, $m_6$, $m_7$, $m_8$, $m_0$, $m_1$, $m_2$, $m_3$, $m_4$]. A rotate-right by s=5 operation would give the set G=[$m_4$, $m_5$, $m_6$, $m_7$, $m_8$, $m_0$, $m_1$, $m_2$, $m_3$].

The barrel rotator 300 is reconfigurable to circularly shift different numbers n of input messages. Thus, the value of n can be changed by simply changing the values of the select logic control signals to the multiplexers. The embodiment shown in FIG. 3 is reconfigurable to: (1) circularly shift a group of three input messages (i.e., n=3); (2) circularly shift a group of six input messages (i.e., n=6); and (3) circularly shift a group of nine input messages (i.e., n=9). A barrel rotator configured to rotate n=3 input messages is referred to as a 3×3 barrel rotator because it has three inputs and three outputs. Similarly, a barrel rotator configured to rotate n=6 input messages has six inputs and six outputs and is referred to as a 6×6 barrel rotator. A barrel rotator configured to rotate n=9 input messages is referred to as a 9×9 barrel rotator. Thus, the barrel rotator 300 of FIG. 3 is reconfigurable to function as a 3×3 barrel rotator, a 6×6 barrel rotator and a 9×9 barrel rotator. In general, barrel rotators can be specified as z×z barrel rotators (thus, n=z). In the examples above z can be equal to 3, 6 or 9. As explained herein, z can assume other values.

Figure 4:
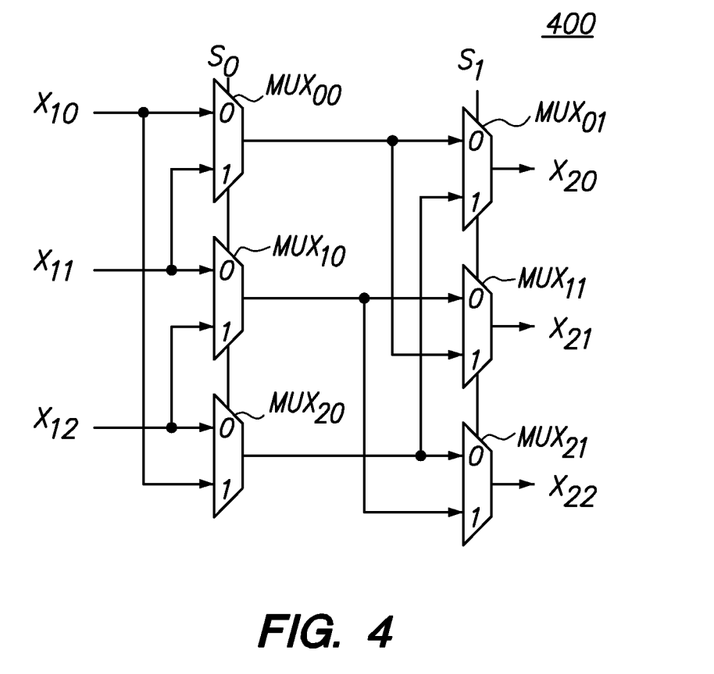
FIG. 4 illustrates a first barrel rotator circuit whose function can be performed by the reconfigurable barrel rotator circuit of FIG. 3.

FIG. 4 illustrates a 3×3 barrel rotator circuit 400 whose function can be performed by the reconfigurable barrel rotator circuit 300 of FIG. 3; FIG. 5 illustrates a 6×6 barrel rotator circuit 500 whose function can be performed by the reconfigurable barrel rotator circuit 300 of FIG. 3; and FIG. 6 illustrates a 9×9 barrel rotator circuit 600 whose function can be performed by the reconfigurable barrel rotator circuit 300 of FIG. 3.

Figure 6:
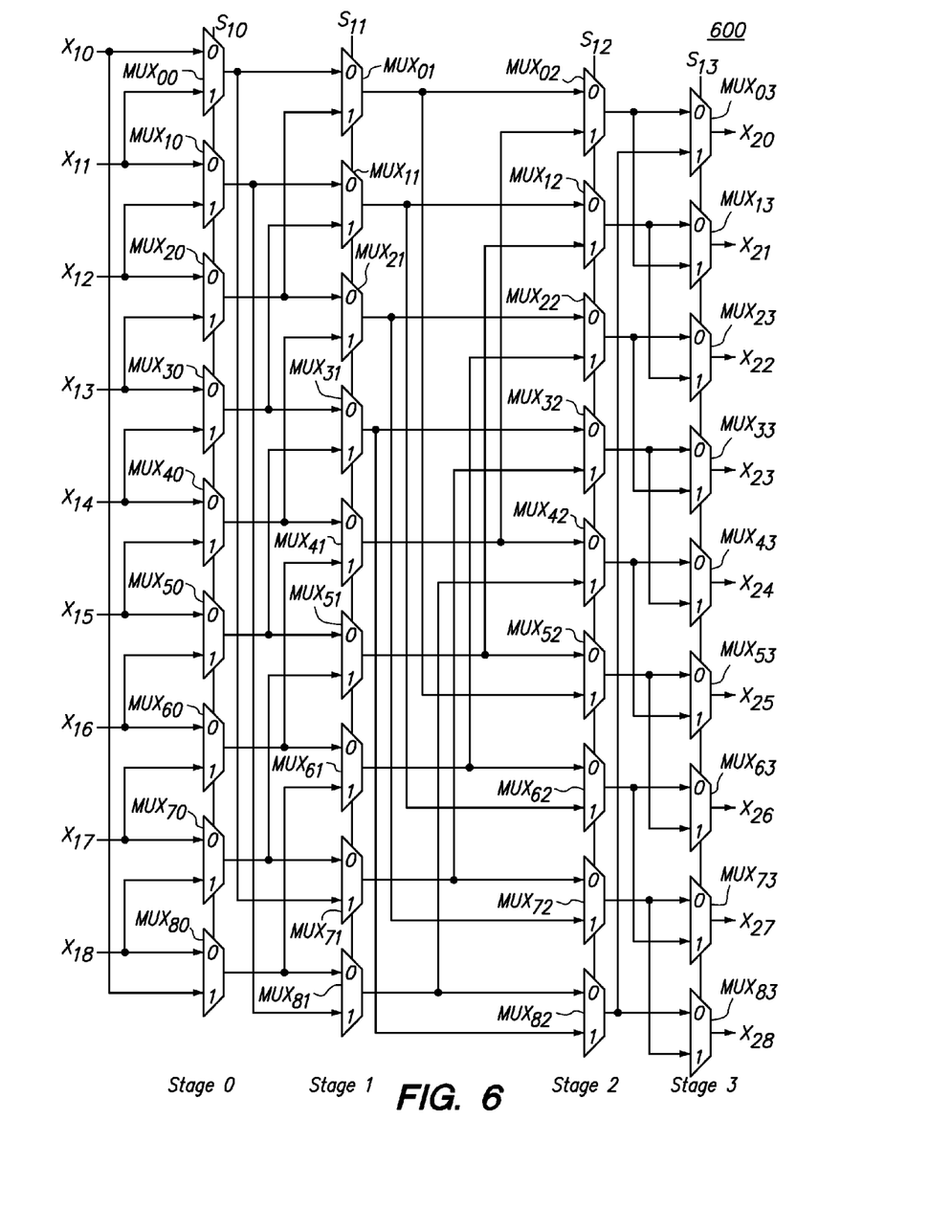
FIG. 6 illustrates a third barrel rotator circuit whose function can be performed by the reconfigurable barrel rotator circuit of FIG. 3.

The barrel rotators of FIGS. 4, 5 and 6, have a fixed value for n. For these barrel rotators, the total number of m-bit multiplexers is n·⌈$\log_2 n$⌉. An n×n m-bit barrel rotator consists of p=⌈$\log_2 n$⌉ stages of multiplexers. For this reason, these are referred to as logarithmic barrel rotators (LBRs).

A rule that defines the interconnection of the multiplexers for the fixed barrel rotators is as follows:

Multiplexer j (j$\epsilon$ {0, 1, . . . , n−1}) of stage k (k$\epsilon$ {0, 1, . . . , p−1}) receives as inputs the outputs of the previous stage multiplexers (or the primary inputs in case of k=0) j and mod(j+t, n), where t=$2^k$.

Therefore, for example, referring to FIG. 5, $MUX_{00}$ is multiplexer j=0 of stage k=0. Because k=0, the inputs to $MUX_{00}$ are therefore the primary inputs $X_{10}$ and $X_{11}$. As another example, referring to FIG. 5, $MUX_{22}$ is multiplexer j=2 of stage k=2. Therefore, the inputs to $MUX_{22}$ are the outputs of the previous stage multiplexer j, which is $MUX_{21}$, and the previous stage multiplexer mod(j+t, n), which is $MUX_{01}$ since j=2, t=4, n=6 and mod(2+4, 6)=0.

Referring to FIG. 5, the three 1-bit signals $S_0$, $S_1$ and $S_2$ control the cyclic-shift operation. The number of the required control signals $S_k$ is equal to p (p=⌈$\log_2 n$⌉), i.e., one 1-bit signal for every stage of multiplexers. We assume n=6, s=2 and r=0. As mentioned before, s$\epsilon$ {0, 1, . . . , n−1}. The 6×6 barrel rotator consists of p=⌈$\log_2 6$⌉=3 stages of multiplexers. This configuration corresponds to the interconnection implied by the sub-matrix of FIG. 7. We define b=|(n·r)−s|. Value b is positive and less than or equal to n−1. Its binary representation comprises of p=⌈$\log_2 n$⌉ bits. In this example, it is b=2 and the p-bit binary representation $b_{p-1} b_{p-2} \ldots b_0$ of the b value is 010. The binary value $b_k$ is assigned to the select input $S_k$, in order to rotate-left by s the input messages [$X_{10}$, $X_{11}$, $X_{12}$, $X_{13}$, $X_{14}$, $X_{15}$]. Therefore, referring to FIG. 5, it is $S_0$=0, $S_1$=1 and $S_2$=0. $MUX_{00}$ allows input $X_{10}$ to pass through, unlike $MUX_{50}$. Select signal $S_1$ is equal to 1 and $S_2$ is equal to 0, so the output of $MUX_{00}$ passes through $MUX_{41}$ and thereafter the output of $MUX_{41}$ passes through $MUX_{42}$. Therefore, the input $X_{10}$ is connected with the output $X_{24}$ for this particular permutation network configuration. Respectively, input $X_{11}$ is connected to output $X_{25}$, input $X_{12}$ is connected to output $X_{20}$, input $X_{13}$ is connected to output $X_{21}$, input $X_{14}$ is connected to output $X_{22}$ and input $X_{15}$ is connected to output $X_{23}$, realizing the desired connectivity. With respect to the aforementioned notation it is $F=[X_{10}, X_{11}, X_{12}, X_{13}, X_{14}, X_{15}]$ and $G=[X_{12}, X_{13}, X_{14}, X_{15}, X_{10}, X_{11}]$. This configuration (n=6, s=2 and r=0) is equivalent to the (n=6, s=4 and r=1) configuration (rotate-right by 4), as proven by b=|(6·0)−2|=|(6·1)−4|=2.

The reconfigurable barrel rotator circuit supports circular shifting of a set of n input messages applied to the array of inputs by a selected number of positions at the array of outputs and the number n of messages contained in the set is selectable from among a set D of d values where $D=[z_0, z_1, \ldots, z_{d-1}]$.

In general, a reconfigurable permutation network able to support all these d configurations consists of a $z_{d-1} \times z_{d-1}$ barrel rotator and a plurality of additional multiplexers, called secondary. The number of primary multiplexers that compose the $z_{d-1} \times z_{d-1}$ barrel rotator is divided into d groups, namely Group 0, Group 1 ... Group d−1. The aforementioned secondary multiplexers are placed at one of the inputs of all the primary multiplexers of the $z_{d-1} \times z_{d-1}$ barrel rotator which belong to Group f, where $f \in \{0, 1, \ldots, d-2\}$, as follows. Group f consists of the primary multiplexers $z_f - 2^k$ to $z_f - 1$ of stage k, where $k \in \{0, 1, \ldots, p_f - 1\}$ and $p_f = \lceil \log_2 z_f \rceil$. A Group f primary multiplexer j ($j \in \{0, 1, \ldots, z_f - 1\}$) of stage k ($k \in \{0, 1, \ldots, p_f - 1\}$ and $p_f = \lceil \log_2 z_f \rceil$) receives as inputs the outputs of the previous stage primary multiplexers (or the primary inputs in case of k=0) j and mod (j+t, $z_{d-1}$), when the desired configuration is not $z_f$, otherwise it receives as inputs the outputs of the previous stage primary multiplexers (or the primary inputs in case of k=0) j and mod (j+t, $z_f$). In this manner a secondary multiplexer is placed before one of the inputs of all the Group f multiplexers of the $z_{d-1} \times z_{d-1}$ barrel rotator. All the secondary multiplexers of Group f are controlled by the signal $S_{2f}$. Given a set D of d configurations $[z_0, z_1, \ldots, z_{d-1}]$, d−1 select inputs $S_2 f$ are required, where $f \in \{0, 1, \ldots, d-2\}$. In order to realize the $z_q \times z_q$ configuration, where $q \in \{0, 1, \ldots, d-1\}$, it must be $S_{2f}=1$ when f=q, otherwise $S_{2f}=0$.

As an exemplary embodiment, the barrel rotator 300 of FIG. 3 supports circular shifting of a set of n input messages applied to the array of inputs by a selected number of positions at the array of outputs and the number n of messages contained in the set is selectable from among a set D of d=3 values where $D=[z_0, z_1, z_2]=[3, 6, 9]$. Select inputs $S_{20}$ and $S_{21}$ are used to set the operation mode of the barrel rotator 300. More specifically, inputs $S_{20}$ and $S_{21}$ determine the number n of input messages on which the shift operation will be applied. For the $z_0 \times z_0$ configuration it is $S_{20}=1$ and $S_{21}=0$, for the $z_1 \times z_1$ configuration it is $S_{20}=0$ and $S_{21}=1$ and for the $z_2 \times z_2$ configuration it is $S_{20}=0$ and $S_{21}=0$.

The embodiment depicted in FIG. 3, is composed of three groups of primary multiplexers: a first group, namely Group 0, consisting of the primary multiplexer $z_0 - 1$ of stage 0 and the primary multiplexers $z_0 - 2$ and $z_0 - 1$ of stage 1; A second group, Group 1, consisting of the primary multiplexer $z_1 - 1$ of stage 0, the primary multiplexers $z_1 - 2$ and $z_1 - 1$ of stage 1 and the primary multiplexers $z_1 - 4$ to $z_1 - 1$ of stage 2; and a third group, Group, 2 consisting of all the remaining primary multiplexers.

Thus, referring to FIG. 3, Group 0 includes the primary multiplexers $MUX_{20}$, $MUX_{11}$, and $MUX_{21}$. In general, group 0 consists of the primary multiplexers ($z_0 - 2^k$) to ($z_0 - 1$) of stage k, where $k \in \{0, 1, \ldots, p_0 - 1\}$ and $p_0 = \lceil \log_2 z_0 \rceil$.

Group 1 includes $MUX_{50}$, $MUX_{41}$, $MUX_{51}$, $MUX_{22}$, $MUX_{32}$, $MUX_{42}$, and $MUX_{52}$. In general, Group 1 consists of the primary multiplexers $z_1 - 2^k$ to $z_1 - 1$ of stage k, where $k \in \{0, 1, \ldots, p_1 - 1\}$ and $p_1 = \lceil \log_2 z_1 \rceil$.

The remainder of the primary multiplexers is included in Group 2.

For the primary multiplexers of Group 2, the same interconnection rule is used as in the single-mode case. Specifically, a Group 2 primary multiplexer j ($j \in \{0, 1, \ldots, z_2 - 1\}$) of stage k ($k \in \{0, 1, \ldots, p_2 - 1\}$ and $p_2 = \lceil \log_2 z_2 \rceil$) receives as inputs the outputs of the previous stage primary multiplexers (or the primary inputs in case of k=0) j and mod(j+t, $z_2$), where $t=2^k$.

A Group 0 primary multiplexer j ($j \in \{0, 1, \ldots, z_0 - 1\}$) of stage k ($k \in \{0, 1, \ldots, p_0 - 1\}$ and $p_0 = \lceil \log_2 z_0 \rceil$) receives as inputs the outputs of the previous stage primary multiplexers (or the primary inputs in case of k=0) j and mod (j+t, $z_2$), when the desired configuration z is not equal to $z_0$, otherwise it receives as inputs the outputs of the previous stage primary multiplexers (or the primary inputs in case of k=0) j and mod (j+t, $z_0$). This rule implies the existence of some additional multiplexers, placed at one of the inputs of all the primary multiplexers of Group 0. These additional multiplexers are the secondary multiplexers 302, 304 and 306, depicted in FIG. 3. Secondary multiplexers 302, 304 and 306 are placed in one of the inputs of the primary multiplexers $MUX_{20}$, $MUX_{11}$, and $MUX_{21}$, respectively. These secondary multiplexers receive the control signal $S_{20}$.

A Group 1 primary multiplexer j ($j \in \{0, 1, \ldots, z_1 - 1\}$) of stage k ($k \in \{0, 1, \ldots, p_1 - 1\}$ and $p_1 = \lceil \log_2 z_1 \rceil$) receives as inputs the outputs of the previous stage primary multiplexers (or the primary inputs in case of k=0) j and mod (j+t, $z_2$), when the desired configuration z is not equal to $z_1$, otherwise it receives as inputs the outputs of the previous stage primary multiplexers (or the primary inputs in case of k=0) j and mod (j+t, $z_1$). Respectively, this rule implies the existence of some additional multiplexers, placed at one of the inputs of all the primary multiplexers of Group 1. These additional multiplexers are the secondary multiplexers 308, 310, 312, 314, 316, 318 and 320. Secondary multiplexers 308, 310, 312, 314, 316, 318 and 320 are placed in one of the inputs of the primary multiplexers $MUX_{50}$, $MUX_{41}$, $MUX_{51}$, $MUX_{22}$, $MUX_{32}$, $MUX_{42}$, and $MUX_{52}$, respectively. These secondary multiplexers receive the control signal $S_{21}$.

Referring to FIG. 3, the four 1-bit signals $S_{10}$, $S_{11}$, $S_{12}$ and $S_{13}$ control the cyclic-shift operation. The number of the required control signals $S_{1k}$ is equal to $p_{d-1}$ ($p_{d-1}=\lceil \log_2 z_{d-1} \rceil=\lceil \log_2 9 \rceil=4$), i.e., one 1-bit signal for every stage of primary multiplexers. The 9×9 barrel rotator consists of $p_{d-1}=\lceil \log_2 9 \rceil=4$ stages of multiplexers. As mentioned before, $s \in \{0, 1, \ldots, n-1\}$. We assume n=9, s=5 and r=0. It is b=|(9·0)−5|=5 and its $p_{d-1}$-bit binary representation $b_3 b_2 b_1 b_0$ is 0101. With respect to the aforementioned rules, it is $S_{20}=0$ and $S_{21}=0$. Furthermore, the binary value $b_k$ is assigned to the select input $S_{1k}$, realizing the desired connectivity in order to rotate-left by the input messages [$X_{10}$, $X_{11}$, $X_{12}$, $X_{13}$, $X_{14}$, $X_{15}$, $X_{16}$, $X_{17}$, $X_{18}$]. In case where r=1, the procedure is similar (b=4) and the performed function is rotate-right.

In another example where n=6, we assume a rotate factor s equal to 2 and r=0. It is b=|(n·r)−s|=|(6·0)−2|=2. For this 6×6 configuration, it is $S_{20}=0$ and $S_{21}=1$. The 4-bit binary representation of 2 is 0010. We assign the binary value $b_k$ to the input $S_{1k}$, realizing the desired connectivity. Select signal $S_{10}$ is equal to 0, so $MUX_{00}$ allows input $X_{10}$ to pass through, unlike $MUX_{80}$. Select signal $S_{11}$ is equal to 1, $S_{20}=0$ and $S_{21}=1$, so the output of $MUX_{00}$ passes through $MUX_{41}$ and $MUX_{71}$, unlike $MUX_{01}$ and 304. Thereafter, the output of $MUX_{41}$ passes through $MUX_{42}$ and $MUX_{43}$, since $S_{12}$ and $S_{13}$ are equal to 0. Similarly, the output of $MUX_{71}$ passes through MUX$_{72}$ and MUX$_{73}$. Therefore, the input X$_{10}$ is connected to the outputs X$_{24}$ and X$_{27}$ for this particular configuration. Respectively, input X$_{11}$ is connected to outputs X$_{25}$ and X$_{28}$, input X$_{12}$ is connected to output X$_{20}$, input X$_{13}$ is connected to output X$_{21}$, input X$_{14}$ is connected to output X$_{22}$, input X$_{15}$ is connected to output X$_{23}$, input X$_{16}$ is not connected to any output, input X$_{17}$ is not connected to any output and input X$_{18}$ is connected to output X$_{26}$. Since this is a 6×6 configuration, the inputs X$_{16}$, X$_{17}$, X$_{18}$ and the outputs X$_{26}$, X$_{27}$, X$_{28}$ are not used. With respect to the aforementioned notation it is F=[X$_{10}$, X$_{11}$, X$_{12}$, X$_{13}$, X$_{14}$, X$_{15}$] and G=[X$_{12}$, X$_{13}$, X$_{14}$, X$_{15}$, X$_{10}$, X$_{11}$], which is the desired connectivity. In case where r=1, the procedure is similar (b=4) and the performed operation is rotate-right.

In another example where n=3, we assume a rotate factor s equal to 2 and r=1. It is b=|(n·r)−s|=|(3·1)−2|=1. For this 3×3 configuration, it is S$_{20}$=1 and S$_{21}$=0. The 4-bit binary representation of 2 is 0001. We assign the binary value b$_k$ to the input S$_{1k}$, realizing the desired connectivity. Select signal S$_{10}$ is equal to 1, S$_{20}$=1 and S$_{21}$=0 so 302, MUX$_{20}$ and MUX$_{80}$ allow input X$_{10}$ to pass through, unlike MUX$_{00}$ and 308. Thereafter, the output of MUX$_{20}$ passes through MUX$_{21}$, MUX$_{22}$ and MUX$_{23}$, since S$_{11}$, S$_{12}$ and S$_{13}$ are equal to 0. Similarly, the output of MUX$_{80}$ passes through MUX$_{81}$, MUX$_{82}$ and MUX$_{83}$. Therefore, the input X$_{10}$ is connected to the outputs X$_{22}$ and X$_{28}$. Respectively, input X$_{11}$ is connected to output X$_{20}$ and input X$_{12}$ is connected to output X$_{21}$. Since this is a 3×3 configuration, the inputs X$_{13}$, X$_{14}$, X$_{15}$, X$_{16}$, X$_{17}$, X$_{18}$ and the outputs X$_{23}$, X$_{24}$, X$_{25}$, X$_{26}$, X$_{27}$, X$_{28}$ are not used. With respect to the aforementioned notation it is F=[X$_{10}$, X$_{11}$, X$_{12}$] and G=[X$_{11}$, X$_{12}$, X$_{10}$], which is the desired connectivity for the rotate-right by 2 operation.

Thus, the barrel rotator 300 of FIG. 3 has a reconfigurable architecture that implements the functionality of all three of the networks of FIGS. 4, 5 and 6. More particularly, this 9×9 rotate-left/right permutation network can also function as a 3×3 or a 6×6 rotate-left/right circuit. A practical implementation of this permutation network 300 is the interconnection of a changeable number n of variable node processors and n check node processors.

Generally, for a z×z reconfigurable barrel rotator embodiment, in the case of an n×n configuration (n≤z) the ($\lceil \log_2 z \rceil$−$\lceil \log_2 n \rceil$) most significant bits of the binary representation of b are equal to zero. This is because the first $\lceil \log_2 n \rceil$ stages realize the desired shifting operation and the remaining ($\lceil \log_2 z \rceil$−$\lceil \log_2 n \rceil$) stages are essentially bypassed.

Figure 11:
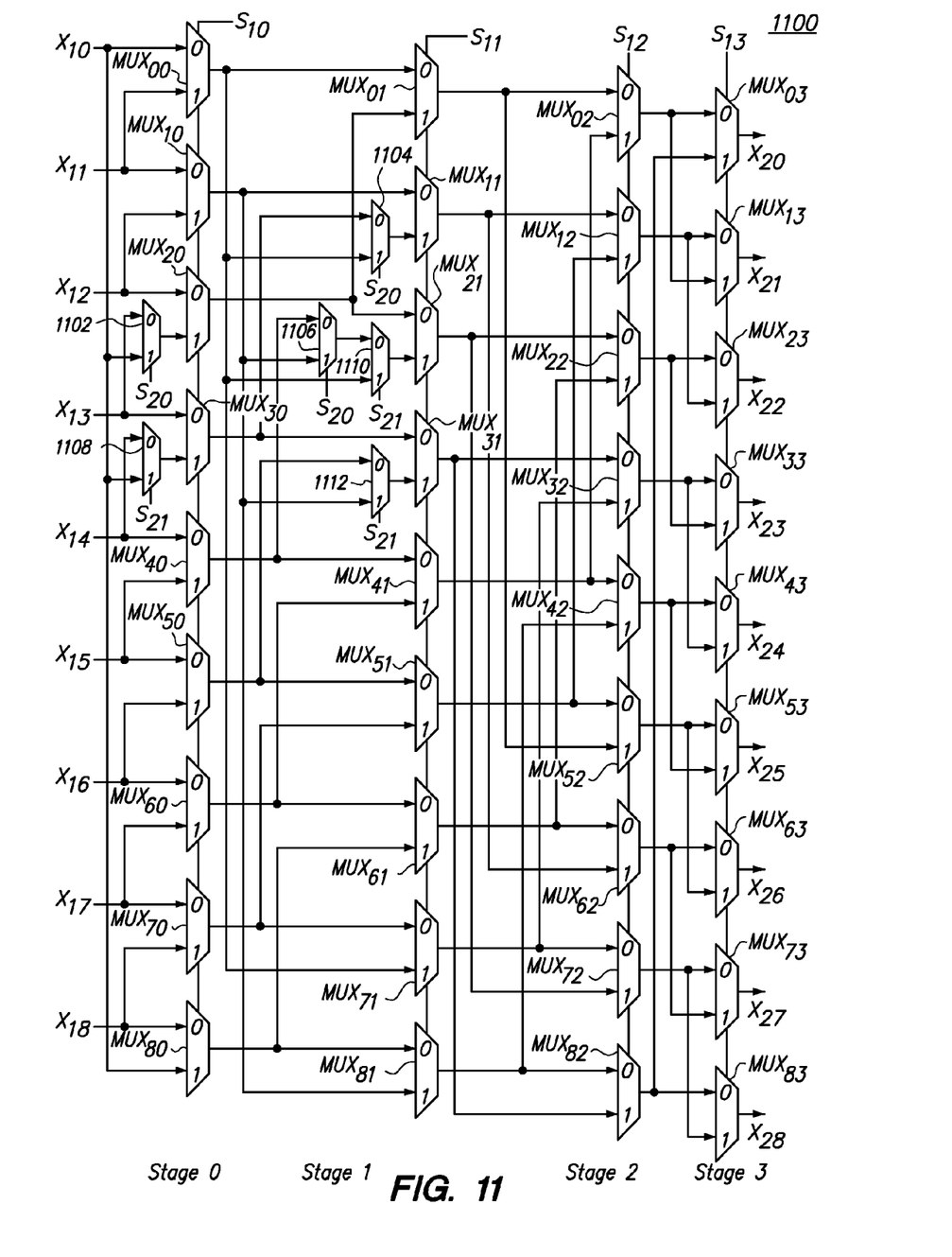
FIG. 11 illustrates a reconfigurable barrel rotator circuit in accordance with an embodiment of the present invention.

In another exemplary embodiment, the barrel rotator of FIG. 11 supports circular shifting of a set of n input messages applied to the array of inputs by a selected number of positions at the array of outputs and the number n of messages contained in the set is selectable from among a set D of d=3 values where D=[z$_0$, z$_1$, z$_2$]=[3, 4, 9].

The barrel rotator 1100 is reconfigurable to: (1) circularly shift a group of three input messages (i.e., n=3); (2) circularly shift a group of four input messages (i.e., n=4); and (3) circularly shift a group of nine input messages (i.e., n=9).

Referring to FIG. 11, with respect to the aforementioned reconfigurable permutation network construction technique, Group 0 includes the primary multiplexers MUX$_{20}$, MUX$_{11}$, and MUX$_{21}$, and Group 1 consists of the primary multiplexers MUX$_{30}$, MUX$_{21}$, and MUX$_{31}$. The remainder of the primary multiplexers is included in Group 2. In this embodiment there is a primary multiplexer (MUX$_{21}$) that belongs to more than one group. This implies the existence of two additional multiplexers, placed at one of the inputs of the primary multiplexer MUX$_{21}$, as specified by the corresponding rules for Group 0 and Group 1. These additional multiplexers are the secondary multiplexers 1106 and 1110, as depicted in FIG. 11. Moreover, secondary multiplexers 1102, 1104, 1108, and 1112 are placed in one of the inputs of the primary multiplexers MUX$_{20}$, MUX$_{11}$, MUX$_{30}$, and MUX$_{31}$, respectively. Secondary multiplexers 1102, 1104, and 1106, imposed by the corresponding rule of Group 0, receive the control signal S$_{20}$. Secondary multiplexers 1108, 1110, and 1112, imposed by the corresponding rule of Group 1, receive the control signal S$_{21}$.

Embodiments of the present invention can be extended to any set D of d values, D=[z$_0$, z$_1$, . . . , z$_{d-1}$], where 2≤z$_0$<z$_1$< . . . <z$_{d-1}$.

The aforementioned technique for implementing reconfigurable barrel rotators ensures that every primary multiplexer belongs to at most one group for any set D of d values, D=[z$_0$, z$_1$, . . . , z$_{d-1}$], where 2≤z$_0$<z$_1$< . . . <z$_{d-1}$, under the following condition:

$$z_k \geq z_{k-1} + 2^{(\lceil \log_2 z_{k-1} \rceil - 1)} \text{ for all } k \in \{1, 2, \ldots, d-2\}. \quad (1)$$

For example, assuming d=3 and z$_0$=3 (z$_1$=z$_{d-2}$) the following condition is derived: $z_1 \geq z_0 2^{(\lceil \log_2 z_0 \rceil)-1}$, which gives z$_1$≥3+ $2^{(2-1)}$, or z$_1$≥5. In the embodiment of FIG. 3, it is z$_1$=6 and the condition is satisfied. In the embodiment of FIG. 11 it is z$_1$=4, so there is at least one primary multiplexer which belongs to more than one groups.

In the case that condition (1) is not met, there exist primary multiplexers that belong to two or more groups. These multiplexers are part of the stage ($\lceil \log_2 z_{k-1} \rceil$−1) if and only if condition (1) is violated for z$_k$. The violation of condition (1) may increase the maximum delay critical path of the barrel rotator circuit.

Assuming D=[z$_0$, z$_1$, . . . , z$_{d-1}$], we define W$_{jk}$ to be a metric associated with each primary multiplexer MUX$_{jk}$. We define W$_{jk}$=1 when the primary multiplexer MUX$_{jk}$ belongs to Group d−1, and W$_{jk}$=$\lceil \log_{2(w+1)} \rceil$+1, when the primary multiplexer MUX$_{jk}$ belongs to a number of w Groups other than Group d−1. This is the delay, measured in terms of multiplexer count, introduced by the primary multiplexer MUX$_{jk}$ and its secondary multiplexers. For example, in the embodiment of FIG. 11: MUX$_{01}$ belongs to Group 2 and it is W$_{01}$=1; MUX$_{11}$ belongs to Group 0 only and it is W$_{11}$=$\lceil \log_2(1+1) \rceil$+1=2; and MUX$_{21}$ belongs to Group 0 and Group 1 and it is W$_{21}$=$\lceil \log_2(2+1) \rceil$+1=3.

The upper bound C$_{LBR}$ of the number of multiplexers (primary and secondary) that comprise the critical path of the reconfigurable barrel rotator is given by the following equation:

$$C_{LBR} = \max(W_{j0}) + \max(W_{j1}) + \ldots + \max(W_{jp}), \quad (2)$$

where j∈{0, 1, . . . , z$_{d-1}$−1} and p=$\lceil \log_2 z_{d-1} \rceil$.

In the case that condition (1) is not met for at least one multiplexer of stage k, value max(W$_{jk}$), which represents the maximum delay of this specific stage is increased, with a consequent increase of the C$_{LBR}$ value. Although there is not a one-to-one relationship between the critical path delay and the C$_{LBR}$ value, C$_{LBR}$ gives an upper bound of this delay. By choosing values of z$_k$ that satisfy all conditions derived by (1) the maximum delay critical path through the reconfigurable barrel rotator is minimized.

In general, the number M$_s$ of the additional secondary multiplexers required for a reconfigurable barrel rotator embodiment, for a set D of d values [z$_0$, z$_1$, . . . , z$_{d-1}$], is given by the following equation:

$$M_s = (2^{\lceil \log_2 z_0 \rceil} - 1) + (2^{\lceil \log_2 z_1 \rceil} - 1) + \ldots + (2^{\lceil \log_2 z_{d-2} \rceil} - 1) \quad (3)$$

Equation (3) gives a number of M$_s$=(2$^2$−1)+(2$^3$−1)=3+7=10 secondary multiplexers for the case of the barrel rotator 300 circuit and a number of $M_s=(2^2-1)+(2^2-1)=3+3=6$ secondary multiplexers for the case of the barrel rotator 1100 embodiment. These values are verified by the circuits shown in FIGS. 3 and 11.

In the case of the 802.11n/ac IEEE standards the number of inputs/outputs of the permutation network should be 27, 54 or 81. The transition from an embodiment of the aforementioned architecture with D=[3, 6, 9] to an embodiment with D=[27, 54, 81] is straightforward, particularly considering that condition (1) is met for the [27, 54 and 81] configuration.

While the reconfigurable barrel rotators 300 and 1100 are shown comprising an array of multiplexers, the barrel rotators 300 and 1100 can be implemented as application specific integrated circuits (ASICs), programmable logic arrays (PLAs), an arrangement of discrete components or other hardware devices.

The present invention can be extended to embodiments able to perform other shift operations as well, like logical shift and arithmetic shift.

The foregoing detailed description of the present invention is provided for the purposes of illustration and is not intended to be exhaustive or to limit the invention to the embodiments disclosed. Accordingly, the scope of the present invention is defined by the appended claims.

What is claimed is:

1. An apparatus comprising:
an array of multiplexers, the array having a plurality of inputs and a plurality of outputs, wherein the array of multiplexers is configured to rotate a set of n input messages applied to the inputs by a selected number of positions at the outputs and wherein the number n of messages contained in the set is selectable from among a plurality of values given as $z_0$, $z_1$ and $z_2$, wherein the array of multiplexers are arranged in at least a first stage, given as stage 0, second stage, given as stage 1, and a third stage, given as stage 2, each stage comprising multiplexers identifiable by a variable j, and the array comprising at least three groups of multiplexers wherein a first group comprises multiplexer $z_0-1$ of stage 0 and multiplexers $z_0-2$ and $z_0-1$ of stage 1, a second group comprises multiplexer $z_1-1$ of stage 0, multiplexers $z_1-2$ and $z_1-1$ of stage 1 and multiplexers $z_1-4$ to $z_1-1$ of stage 2, and a third group comprising the remaining multiplexers of the array, further wherein
each first group multiplexer (j∈{0, 1, . . . , $z_0-1$}) of stage k (k∈{0, 1, . . . , $p_0-1$} and $p_0=\lceil \log_2 z_0 \rceil$) receives as inputs the outputs of the previous stage multiplexers (or the array of inputs in case of k=0) j and mod(j+t, $z_2$), when the desired configuration z is not equal to $z_0$, otherwise it receives as inputs the outputs of the previous stage multiplexers (or the array of inputs in case of k=0) j and mod (j+t, $z_0$);
each second group multiplexer j (j∈{0, 1, . . . , $z_1-1$}) of stage k (k∈{0, 1, . . . , $p_1-1$} and $p_1=\lceil \log_2 z_1 \rceil$) receives as inputs the outputs of the previous stage multiplexers (or the array of inputs in case of k=0) j and mod(j+t, $z_2$), when the desired configuration z is not equal to $z_1$, otherwise it receives as inputs the outputs of the previous stage multiplexers (or the primary inputs in case of k=0) j and mod(j+t, $z_1$); and
each third group multiplexer j (j∈{0, 1, . . . , $z_2-1$}) of stage k (k∈{0, 1, . . . , $p_2-1$} and $p_2=\lceil \log_2 z_2 \rceil$) receives as inputs the outputs of the previous stage multiplexers (or the primary inputs in case of k=0) j and mod(j+t, $z_2$), where $t=2^k$.

2. The apparatus according to claim 1, being configured to function as a permutation network of an error correction decoder.

3. The apparatus according to claim 2, wherein the error correction decoder is configured to perform message passing among computing nodes of the error correction decoder and wherein the permutation network is configured to route messages among the computing nodes.

4. The apparatus according to claim 2, wherein the error correction decoder is configured to perform error correction decoding on low density parity check (LDPC) codes.

5. The apparatus according to claim 4, wherein the LDPC codes are selected from among codeword lengths of 648, 1296 and 1944 and coding rates of 1/2, 2/3, 3/4 and 5/6.

6. The apparatus according to claim 4, wherein the number n of messages contained in the set assumes the values of 27, 54 and 81.

7. An apparatus comprising:
an array of multiplexers, the array having a plurality of inputs and a plurality of outputs, wherein the array of multiplexers is configured to rotate a set of n input messages applied to the inputs by a selected number of positions at the outputs and wherein the number n of messages contained in the set is selectable from among a set D of d values where D=[$z_0$, $z_1$, . . . , $z_{d-1}$] and $2 \leq z_0 < z_1 < \ldots < z_{d-1}$, and wherein the array of multiplexers includes a $z_{d-1} \times z_{d-1}$ array of primary multiplexers, which compose a $z_{d-1} \times z_{d-1}$ barrel rotator, and secondary multiplexers, the primary multiplexers being divided into d groups, and wherein the secondary multiplexers are placed at one of the inputs of all the primary multiplexers of the barrel rotator which belong to a group f, where f∈{0, 1, . . . , d−2}, such that group f consists of the primary multiplexers $z_f-2^k$ to $z_f-1$ of stage k, where k∈{0, 1, . . . , $p_f-1$} and $p_f=\lceil \log_2 z_f \rceil$, and a group f primary multiplexer j (j∈{0, 1, . . . , $z_f-1$}) of stage k (k∈{0, 1, . . . , $p_f-1$} and $p_f=\lceil \log_2 z_f \rceil$) receives as inputs the outputs of the previous stage primary multiplexers, or the inputs to the barrel rotator in case of k=0, j and mod(j+t, $z_{d-1}$), when the desired configuration is not $z_f$, otherwise it receives as inputs the outputs of the previous stage primary multiplexers, or the inputs to the barrel rotator in case of k=0, j and mod(j+t, $z_f$).

8. The apparatus according to claim 7, wherein a secondary multiplexer is placed before one of the inputs of all the group f multiplexers of the $z_{d-1} \times z_{d-1}$ array of primary multiplexers and all of the secondary multiplexers of group f are controlled by a signal $S_2f$, and wherein, given a set D of d configurations [$z_0, z_1, \ldots, z_{d-1}$], d−1 select inputs $S_{2f}$ are present, where f∈{0, 1, . . . , d−2}.

9. The apparatus according to claim 8, wherein to realize a $z_q \times z_q$ configuration, where q∈{0, 1, . . . , d−1}, $S_2f=1$ when f=q, otherwise $S_{2f}=0$.

10. The apparatus according to claim 7, wherein some primary multiplexers belong to more than one group.

11. The apparatus according to claim 7, wherein the following condition is satisfied:

$$z_k \geq z_{k-1} + 2^{(\lceil \log_2 z_{k-1} \rceil - 1)} \text{ for all } k \in \{1, 2, \ldots, d-2\}.$$

12. The apparatus according to claim 11, wherein every primary multiplexer belongs to at most one group.

13. The apparatus according to claim 7, wherein an upper bound $C_{LBR}$ of a number of multiplexers that comprise a critical path of the array is given by the following:

$$C_{LBR}=\max(W_{j0})+\max(W_{j1})+ \ldots +\max(W_{jp}), \quad (2)$$

where $j \in \{0, 1, \ldots, z_{d-1}-1\}$ and $p = \lceil \log_2 z_{d-1} \rceil$ and $W_{jk}=1$ when the primary multiplexer $MUX_{jk}$ belongs to group d−1, and $W_{jk}=\lceil \log_2(w+1) \rceil +1$, when the primary multiplexer $MUX_{jk}$ belongs to a number of w groups other than group d−1.

14. The apparatus according to claim 13, wherein values of $z_k$ are selected to minimize a maximum delay of the critical path through the array.

15. The apparatus according to claim 7, wherein a number $M_s$ of secondary multiplexers for a set D of d values $[z_0, z_1, \ldots, z_{d-1}]$, is given by the following:

$$M_S = (2^{\lceil \log_2 z_0 \rceil} - 1) + (2^{\lceil \log_2 z_1 \rceil} - 1) + \ldots + (2^{\lceil \log_2 z_{d-2} \rceil} - 1).$$

16. The apparatus according to claim 7, being configured to function as a permutation network of an error correction decoder.

17. The apparatus according to claim 16, wherein the error correction decoder is configured to perform message passing among computing nodes of the error correction decoder and wherein the permutation network is configured to route messages among the computing nodes.

18. The apparatus according to claim 16, wherein the error correction decoder is configured to perform error correction decoding on quasi-cyclic low density parity check (QC-LDPC) codes.

* * * * *